(12) United States Patent
Lim (10) Patent No.: US 7,923,301 B2
(45) Date of Patent: Apr. 12, 2011

(54) ETCHED LEADFRAME STRUCTURE

(75) Inventor: Lay Yeap Lim, Penang (MY)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 12/699,600

(22) Filed: Feb. 3, 2010

(65) Prior Publication Data

US 2010/0136750 A1 Jun. 3, 2010

Related U.S. Application Data

(62) Division of application No. 11/737,630, filed on Apr. 19, 2007, now Pat. No. 7,683,463.

(51) Int. Cl.
*H01L 21/60* (2006.01)

(52) U.S. Cl. .................. 438/123; 257/E21.502

(58) Field of Classification Search ............. 438/123
See application file for complete search history.

(56) References Cited

U.S. PATENT DOCUMENTS

| 7,045,396 B2 * | 5/2006 | Crowley et al. ............. 438/123 |
| 2006/0151858 A1 * | 7/2006 | Ahn et al. ............. 257/666 |

* cited by examiner

*Primary Examiner* — Thao Le (74) *Attorney, Agent, or Firm* — Kilpatrick Townsend & Stockton LLP (57) ABSTRACT

A leadframe structure is disclosed. The leadframe structure includes a first leadframe structure portion with a first thin portion and a first thick portion, where the first thin portion is defined in part by a first recess. It also includes a second leadframe structure portion with a second thin portion and a second thick portion, where the second thin portion is defined in part by a second recess. The first thin portion faces the second recess, and the second thin portion faces the first recess.

12 Claims, 7 Drawing Sheets

UV Light

ETCHED LEADFRAME STRUCTURE

CROSS-REFERENCES TO RELATED APPLICATIONS

This application is a divisional of U.S. patent application Ser. No. 11/737,630, filed Apr. 19, 2007, which is herein incorporated by reference in its entirety for all purposes.

BACKGROUND

Figure 2A:
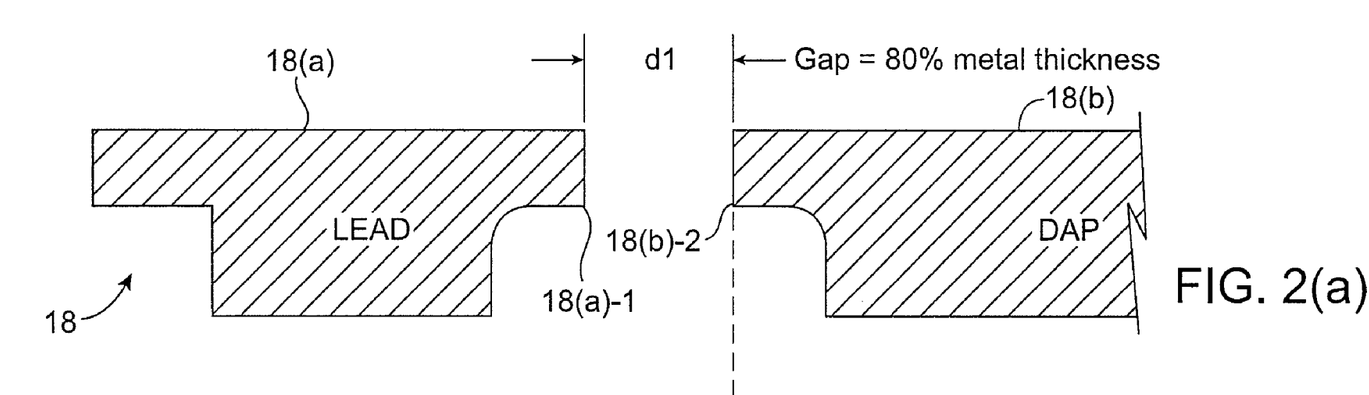
FIG. 2(a) shows a side, cross-sectional view of a portion of a conventional leadframe structure.

A typical semiconductor die package comprises a leadframe structure, a semiconductor die mounted on a die attach pad of the leadframe structure, and a molding material. The leadframe structure is typically etched with recesses so that the molding material locks to the leadframe structure. In the conventional leadframe structure, the etched recesses face each other. An example of this is shown in FIG. 2(a).

Such conventional semiconductor die packages are useful. However, it would be desirable to either reduce the size of a semiconductor die package or increase the size of the die attach pad. By making a semiconductor die package smaller, the semiconductor die package can be used in smaller electronic devices. By increasing the size of a die attach pad, a larger semiconductor die can be used. If the semiconductor die comprises a power transistor, the larger semiconductor die can have a higher current rating than a smaller semiconductor die.

Embodiments of the invention address these problems, individually and collectively.

BRIEF SUMMARY

Embodiments of the invention are directed to leadframe structures, semiconductor die packages including the leadframe structures, and methods for making the leadframe structures and the semiconductor die packages.

One embodiment of the invention is directed to a leadframe structure comprising a first leadframe structure portion comprising a first thin portion and a first thick portion. The first thin portion is defined in part by a first recess. The leadframe structure also comprises a second leadframe structure portion comprising a second thin portion and a second thick portion. The second thin portion is defined in part by a second recess. The first thin portion faces the second recess, and the second thin portion faces the first recess.

Another embodiment of the invention is directed to a semiconductor die package comprising a leadframe structure comprising a first leadframe structure portion comprising a first thin portion and a first thick portion. The first thin portion is defined in part by a first recess, and the first leadframe structure portion is a lead. The leadframe structure has a second leadframe structure portion comprising a second thin portion and a second thick portion. The second thin portion is defined in part by a second recess. The second leadframe structure portion is a die attach pad. The first thin portion faces the second recess, and the second thin portion faces the first recess. A semiconductor die is on the die attach pad, and a molding material is formed around at least part of the leadframe structure and the semiconductor die.

Yet another embodiment of the invention is directed to a method comprising obtaining a leadframe structure precursor including a first leadframe structure precursor portion and a second leadframe structure precursor portion, forming a first recess in the first leadframe structure precursor portion, whereby the first leadframe structure precursor portion thereafter has a first thick portion and a first thin portion, and forming a second recess in the second leadframe structure precursor portion. The second leadframe structure precursor portion thereafter has a second thick portion and a first thin portion. The first thin portion faces the second recess, and the second thin portion faces the first recess in the formed leadframe structure.

Yet another embodiment of the invention is directed to a method for forming a semiconductor die package. The method comprises forming a leadframe structure according to the method described above, and attaching a semiconductor die to the second leadframe structure portion. A molding material may also be molded around the leadframe structure and the semiconductor die.

These and other embodiments of the invention are described in further detail below.

BRIEF DESCRIPTION OF THE DRAWINGS

In the drawings, like numerals designated like elements, and the descriptions of like elements may or may not be repeated.

DETAILED DESCRIPTION

A leadframe structure is disclosed. The leadframe structure includes a first leadframe structure portion with a first thin portion and a first thick portion, where the first thin portion is defined in part by a first recess. It also includes a second leadframe structure portion with a second thin portion and a second thick portion, where the second thin portion is defined in part by a second recess. The first thin portion faces the second recess, and the second thin portion faces the first recess.

Figure 1:
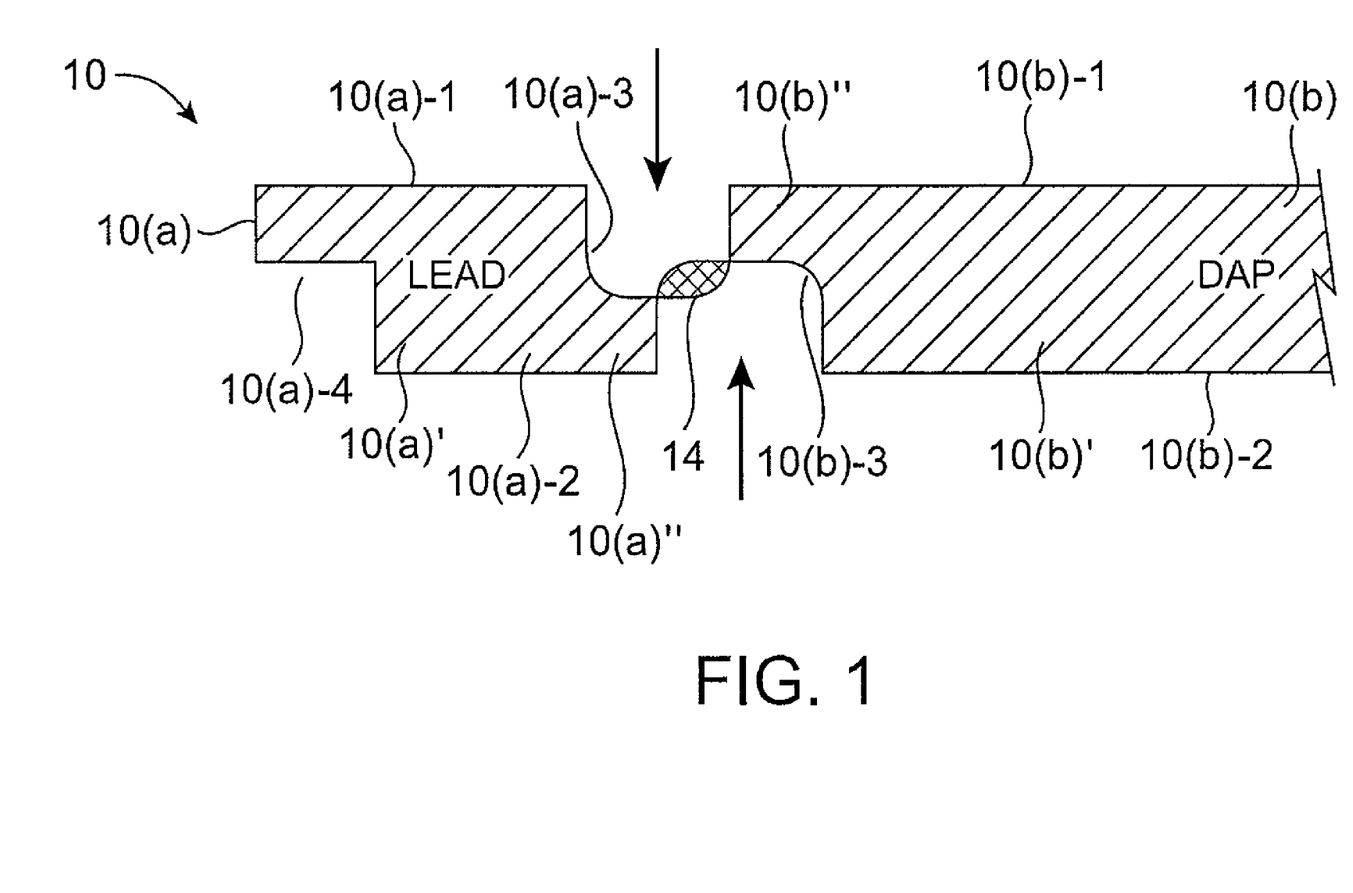
FIG. 1 shows a side, cross-sectional view of a portion of a leadframe structure according to an embodiment of the invention.

FIG. 1 shows part of a leadframe structure 10 comprising a first leadframe structure portion 10(a) and a second leadframe structure portion 10(b) separated from each other by a gap 14. The gap 14 is preferably at least about 6 mils in some embodiments of the invention.

The first leadframe structure portion 10(a) may be a lead such as a gate or a source lead, while the second leadframe structure portion 10(b) may comprise a die attach pad for supporting a semiconductor die (not shown). The second leadframe structure portion 10(b) may also comprise a drain lead. The gap 14 electrically isolates the first and second leadframe structure portions 10(*a*), 10(*b*) from each other.

The first leadframe structure portion 10(*a*) comprises a first surface 10(*a*)-1 and a second surface 10(*a*)-2 opposite the first surface 10(*a*)-1. The first surface 10(*a*)-1 may be connected to a conductive wire or clip, which is in turn connected to a semiconductor die (not shown) that would be mounted on a first surface 10(*b*)-1 of the second leadframe structure portion 10(*b*). The first surface 10(*b*)-1 may be a die attach pad, and may receive a semiconductor die.

The first leadframe structure portion 10(*b*) also comprises a first inner recess 10(*a*)-3 and an outer recess 10(*a*)-4. It also includes a first thick portion 10(*a*)' and a first thin portion 10(*a*)" that is defined in part by the inner recess 10(*a*)-3. The thickness of the first thin portion 10(*a*)" may be less than about 50% of the thickness of the first thick portion 10(*a*)'. In preferred embodiments, the thickness of the first thin portion 10(*a*)" is between about 20-50% of the thickness of the first thick portion 10(*a*)'. Also, the length of the first thin portion 10(*a*)" may be less than about 20, or even 12 mils in embodiments of the invention. The length of the first thin portion 10(*a*)" may also be greater than about 1 mil in some embodiments.

The second leadframe structure portion 10(*b*) comprises a first surface 10(*b*)-1 and a second surface 10(*b*)-2 opposite the first surface 10(*b*)-1. The second leadframe structure portion 10(*b*) also comprises a second inner recess 10(*b*)-3. It also includes a second thick portion 10(*b*)' and a second thin portion 10(*b*)" that is defined in part by the inner recess 10(*b*)-3. The thickness of the first thin portion 10(*b*)" may be less than about 50% of the thickness of the first thick portion 10(*b*)'. In preferred embodiments, the thickness of the first thin portion 10(*b*)" is between about 20-50% of the thickness of the first thick portion 10(*b*)'. Also, the length of the second thin portion 10(*b*)" (or "overhang") may be less than about 20, or even 12 mils in embodiments of the invention. The length of the second thin portion 10(*b*)" may also be greater than about 1 mil in some embodiments.

As shown in FIG. 1, the first thin portion 10(*a*)" of the first leadframe structure portion 10(*a*) faces (e.g., in a horizontal direction parallel to the surfaces 10(*a*)-1 and 10(*b*)-1) the second inner recess 10(*b*)-3 of the second leadframe structure portion 10(*b*). The second thin portion 10(*b*)" of the second leadframe structure portion 10(*b*) faces (e.g., in a horizontal direction parallel to the surfaces 10(*a*)-1 and 10(*b*)-1) the first inner recess 10(*a*)-3 of the first leadframe structure portion 10(*a*). As is apparent from FIG. 1, this configuration allows the first leadframe structure portion 10(*a*) and the second leadframe structure portion 10(*b*) to be closer to each other than they could otherwise be. Although the example in FIG. 1 shows the first thin portion 10(*a*)" in the first leadframe structure portion 10(*a*) being in a non-overlapping position with respect to the second thin portion 10(*b*)" in the second leadframe structure portion 10(*b*)", in other embodiments the first and second thin portions 10(*a*)" and 10(*b*)" could vertically overlap and could still be electrically isolated from each other. This allows the die attach pad of the second leadframe structure portion 10(*b*) to be larger than it would otherwise be.

The die attach pad in the second leadframe structure portion 10(*b*) may optionally include a number of apertures (not shown). Like the recesses 10(*a*)-3, 10(*b*)-3, 10(*a*)-4, they can be used to lock the leadframe structure 10 to a molding material (not shown).

If desired, the leadframe structure 10 can be coated with one or more layers of material. For example, the leadframe structure 10 may include a base metal such as copper or a copper alloy. The base metal may be coated with one or more underbump metallurgy layers. For example, NiPd may be pre-plated on a copper leadframe structure. The total thickness of the leadframe structure can vary. For example, in some embodiments, the thickness of the leadframe structure can be about 8 mils thick (or more or less than this).

FIG. 2(*a*) shows a conventional leadframe structure 18 including a first leadframe structure portion 18(*a*) and a second leadframe structure portion 18(*b*). As shown, first and second thin portions 18(*a*)-1 and 18(*b*)-2 face each other. Consequently, the minimum spacing may be d1, and the gap may be 80% of the thickness of the leadframe structure 18.

Figure 2B:
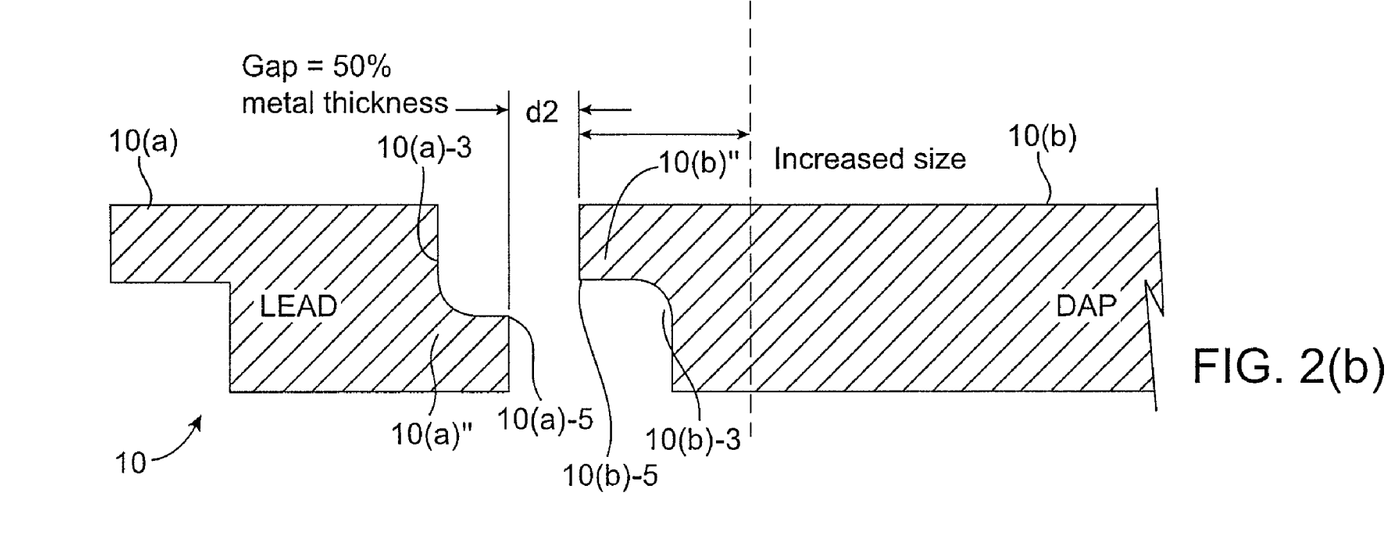
FIG. 2(b) shows a side, cross-sectional view of a portion of a leadframe structure according to an embodiment of the invention.

In comparison, FIG. 2(*b*) shows a leadframe structure 10 according to an embodiment of the invention. It includes a first leadframe structure portion 10(*a*) and a second leadframe structure portion 10(*b*) as described above. As shown in FIG. 2(*b*), the spacing between points 10(*a*)-5 and 10(*b*)-5 of the first and second leadframe structure portions 10(*a*), 10(*b*), respectively, can be decreased in comparison to the leadframe structure 10 in FIG. 2(*a*). Compare, for example, the spacing d1 in FIG. 2(*a*) to the spacing d2 in FIG. 2(*b*). This particular configuration allows one to increase the size of the DAP (die attach paddle) in the second leadframe structure portion 10(*b*), or allows one to make a smaller semiconductor die package.

Figure 3A:
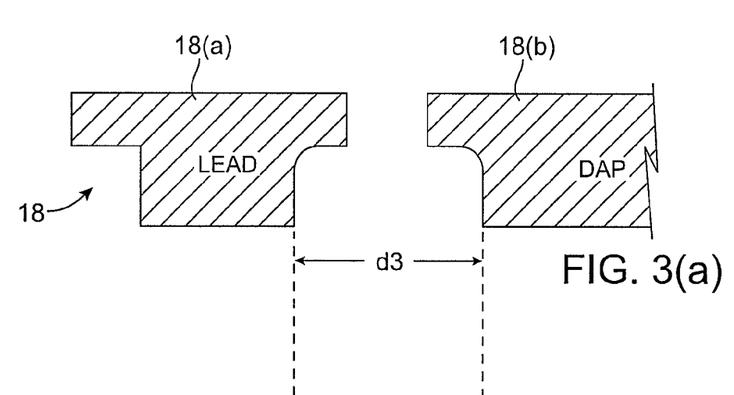
FIG. 3(a) shows a side, cross-sectional view of a portion of a conventional leadframe structure.
Figure 3B:
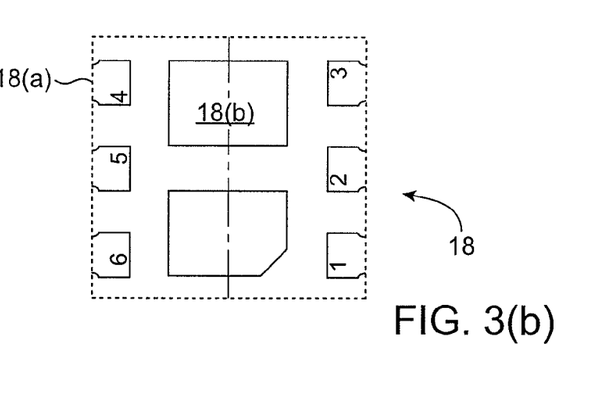
FIG. 3(b) shows a top plan view of a conventional leadframe structure.

FIGS. 3(*a*) and 3(*b*) respectively show a part of a conventional leadframe structure and a top plan view of the leadframe structure 18.

Figure 4A:
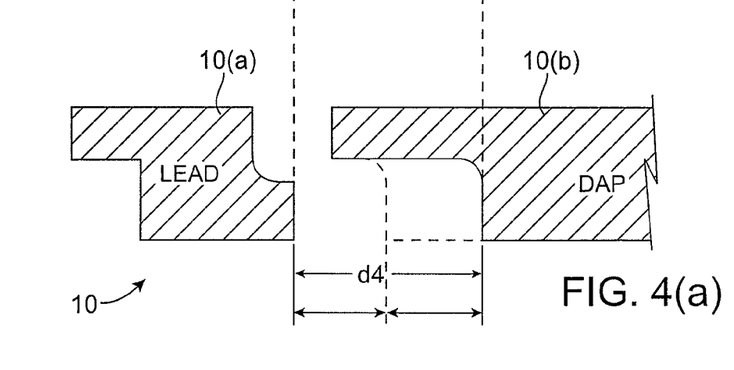
FIG. 4(a) shows a side, cross-sectional view of a portion of a leadframe structure according to an embodiment of the invention.
Figure 4B:
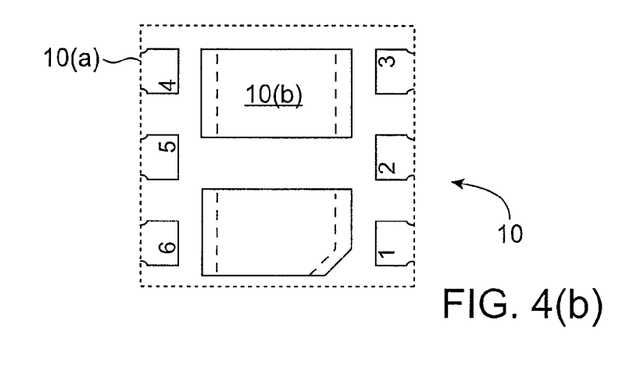
FIG. 4(b) shows a top plan view of a leadframe structure according to an embodiment of the invention.

FIGS. 4(*a*) and 4(*b*) respectively show a part of a leadframe structure 10 according to an embodiment of the invention and a top plan view of the leadframe structure 10.

Comparing FIGS. 3(*a*) and 3(*b*), the die attach pad in the second leadframe structure portion 10(*b*) in FIG. 4(*a*) is larger than the die attach pad in the second leadframe structure portion 18(*b*) shown in FIG. 3(*a*). The relative die attach pad sizes are also shown in FIGS. 3(*b*) and 4(*b*), which respectively show plan views of the conventional leadframe structure and the leadframe structure according to an embodiment of the invention.

Figure 5A:
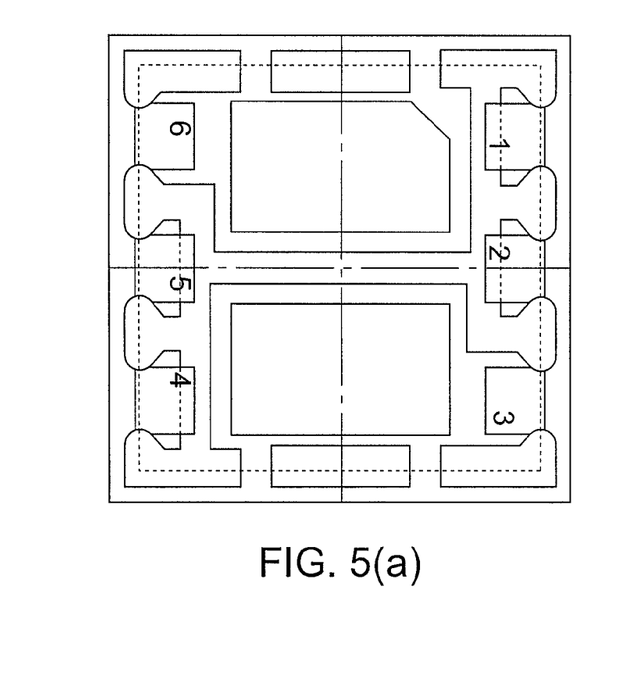
FIGS. 5(a)-5(c) respectively show bottom, top, and side views of a leadframe structure.
Figure 5B:
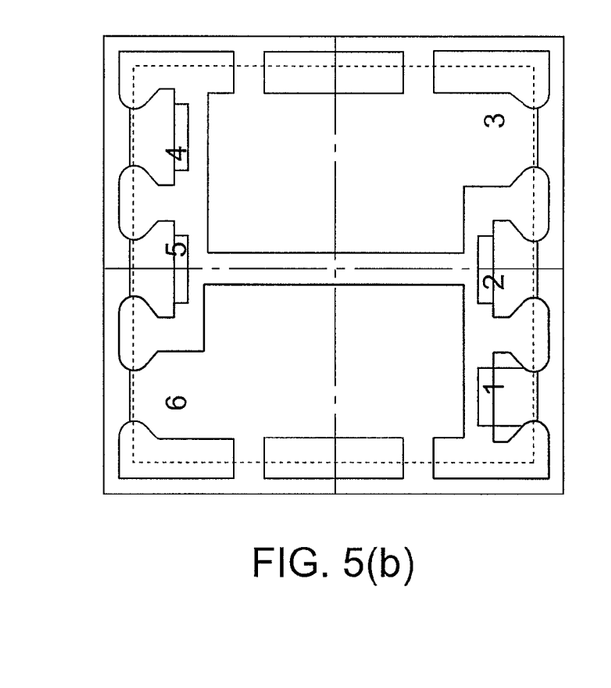
Figure 5C:
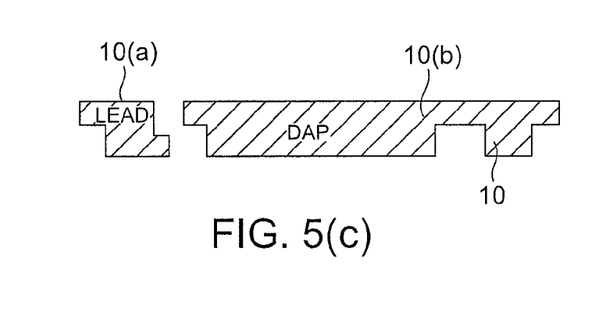

FIGS. 5(*a*)-5(*b*) respectively show bottom and top plan views of a leadframe structure 10. FIG. 5(*c*) shows a side, cross-sectional view of the leadframe structure 10 shown in FIGS. 5(*a*)-5(*b*).

A method for making the above-described leadframe structure 10 can be described with reference to FIGS. 6(*a*)-6(*e*).

FIG. 6(*a*) shows a copper frame 112 (i.e., an example of a leadframe structure precursor) coated on both sides with photoresist layers 104. The copper frame 112 may be obtained in any suitable manner (e.g., stamping, etching, etc.). Also, any suitable photoresist material (e.g., a negative photoresist) and any suitable photoresist deposition process (e.g., spin coating, roller coating, etc.) can be used to form the photoresist layers 104.

FIG. 6(*b*) shows the photoresist layers 104 being exposed with light 108 through masks 106. The masks 106 include light transmissive areas 110 through which light can pass to irradiate the photoresist 104, as well as opaque areas where light cannot pass through. The exposed regions 102 in the photoresist layers 104 correspond to the light transmissive areas 110 in the masks 106. The exposed regions 102 may thereafter be rendered soluble in a developing solution or material.

FIG. 6(*c*) shows the photoresist layers 104 after they have been developed. As shown, gaps 114 are shown where the photoresist layers 104 are developed.

FIG. 6(*d*) shows how etching can be used to etch the copper frame to form a leadframe structure 10. Any suitable etching process can be used in embodiments of the invention. For example, conventional wet or dry etching processes can be used in embodiments of the invention. Etching may form u-grooves or recesses on both sides of the copper frame, simultaneously or sequentially. Preferably, the etching depth is greater than 50% (e.g., 60%) of the thickness of the copper frame.

Figure 6A:
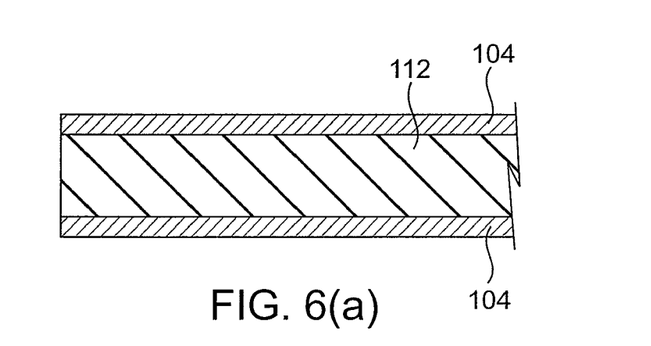
FIGS. 6(a)-6(e) show process steps that can be used in forming a leadframe structure according to an embodiment of the invention.
Figure 6B:
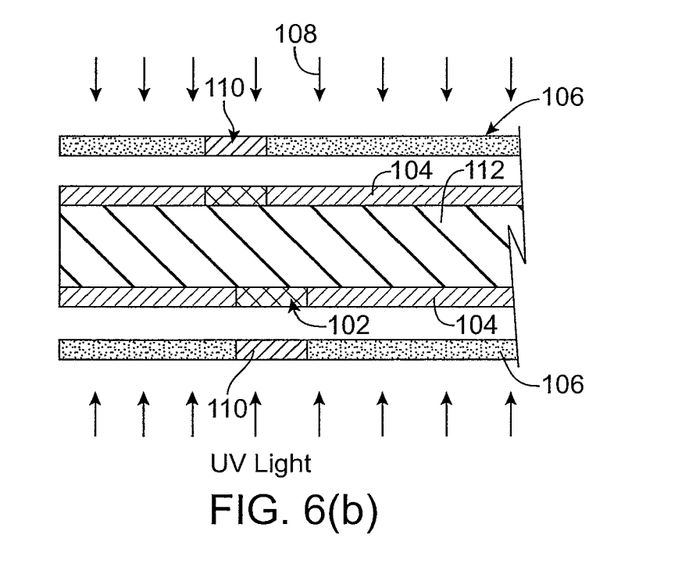
Figure 6C:
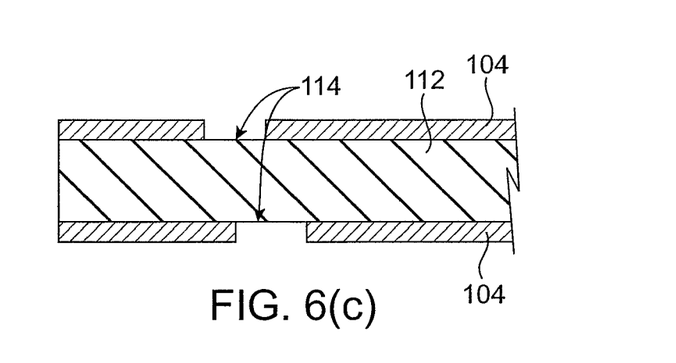
Figure 6D:
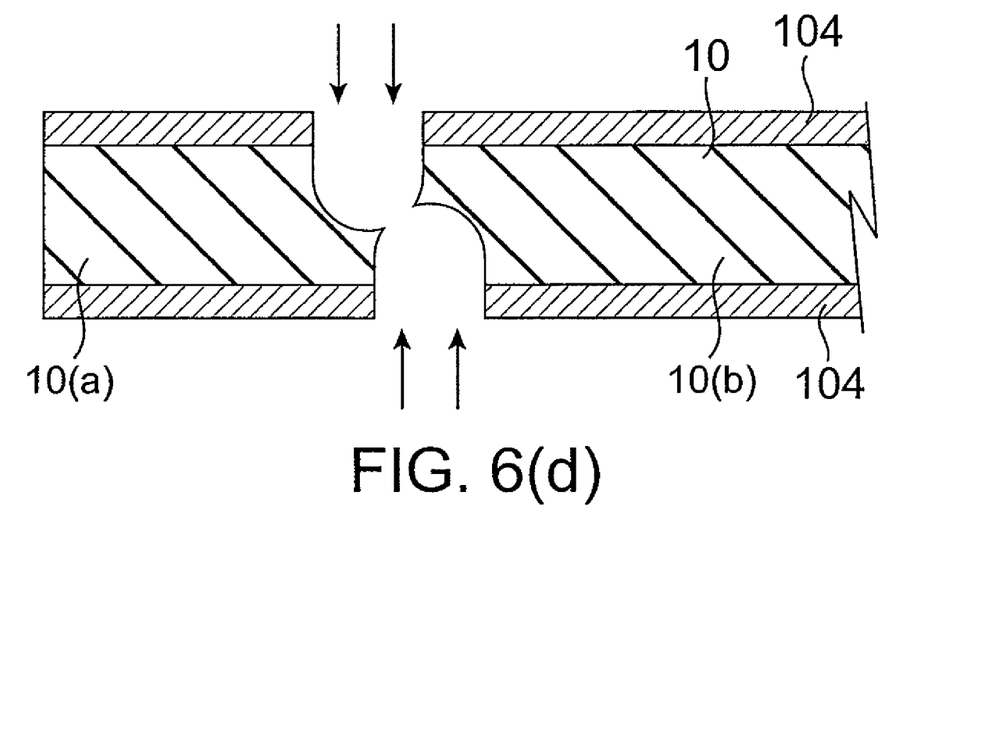
Figure 6E:
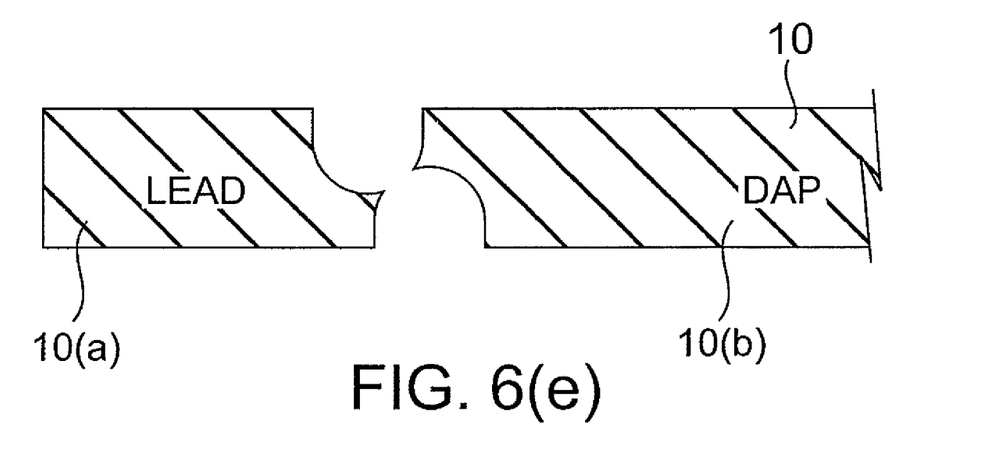

FIG. 6(e) shows the leadframe structure 10 with its first and second leadframe structure portions 10(a), 10(b) after the photoresist layers 104 have been stripped. Any suitable stripping solution may be used to strip the photoresist layers 104 from the leadframe structure.

After the leadframe structure 10 is formed, it may be optionally plated, as described above, to form a plated leadframe structure. The leadframe structure 10 can thereafter be used to support a semiconductor die in a semiconductor die package.

Figure 7:
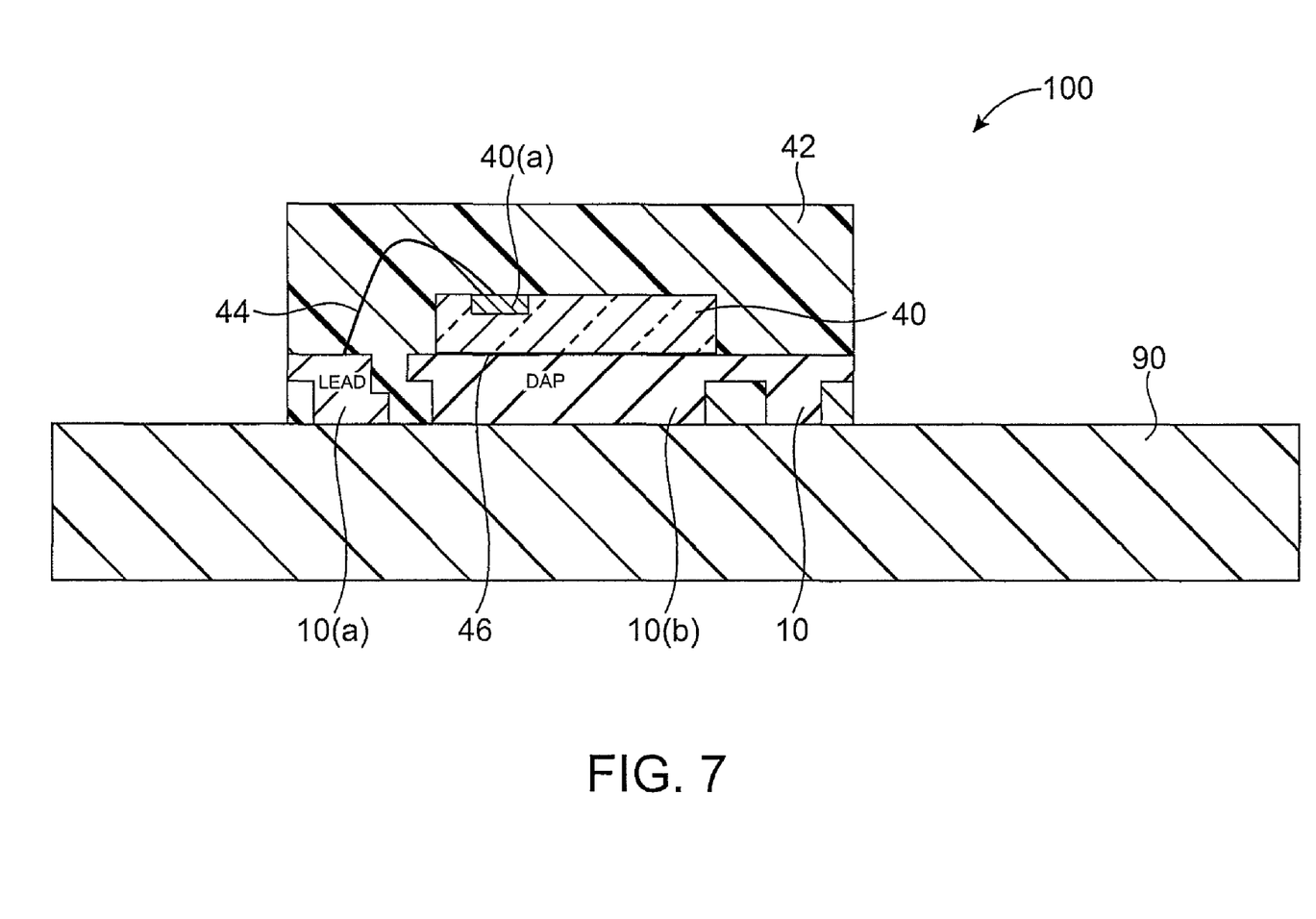
FIG. 7 shows a side, cross-sectional view of a semiconductor die package.

FIG. 7 shows a semiconductor die package 100 comprising the previously described leadframe structure 10 with a semiconductor die 40 mounted on the second leadframe structure portion 10(b). Solder or some other adhesive material may be used to mount the semiconductor die 40 to the second leadframe structure portion 10(b). The semiconductor die 40 may include a contact region 40(a) (e.g., a source region, or gate region in a MOSFET), which may be wirebonded with a wire 44 to the first leadframe structure portion 10(a). As shown, the second leadframe structure portion 10(b) may comprise a die attach pad and one or more output leads (e.g., drain leads), and the first leadframe structure portion 10(a) may comprise one or more input leads (e.g., source or drain leads). The bottom of the die 40 may be electrically coupled to the second leadframe structure portion 10(b), while the top of the die 40 may be electrically coupled to the first leadframe structure portion 10(a).

A molding material 42 may be formed around at least a portion of the leadframe structure 10 and the semiconductor die 40. The molding material 42 may comprise an epoxy based molding material or other suitable molding material. A conventional molding process can be used to shape the molding material 42.

The semiconductor die package 100 may be in the form of an MLP (microlead package) or a leaded package. FIG. 7 shows an MLP type package where the leads in the leadframe structure 10 do not extend past the lateral surfaces of the molding material 42. The bottom and the lateral surfaces of the leadframe structure 10 may be substantially coplanar with adjacent molding material surfaces in the semiconductor die package 100.

The semiconductor dies used in the semiconductor die packages according to preferred embodiments of the invention include vertical power transistors. Exemplary vertical power transistors are described, for example, in U.S. Pat. Nos. 6,274,905 and 6,351,018, both of which are assigned to the same assignee as the present application, and both which are herein incorporated by reference in their entirety for all purposes. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. Other types of devices may simply have an input at one surface of the die and an output at the other opposite surface of the die. Other suitable vertical devices may include diodes.

As shown in FIG. 7, the semiconductor die package 100 may be mounted to a circuit substrate 90 (e.g., a circuit board) to form an electrical assembly. Electrical assemblies may include wireless phone systems, laptop computers, server computers, power supplies, etc.

Embodiments of the invention have a number of advantages. For example, a leadframe structure with offset top and bottom partially etched regions can create openings of at least 50% of the material thickness for good metal to metal clearance between adjacent leadframe structure portions. This allows for larger die attach pad sizes that are achievable compared to conventional leadframe structures while maintaining the same footprint and package size. This allows one to provide a larger die in a smaller semiconductor die package. Also, a larger die attach pad improves manufacturability as there is more room to attach a die, as the distance between the die attach pad edge and the die edge is increased.

Also, by providing a larger die attach pad, for discrete devices, this can result in an improved RDSon performance as a larger die can be used. Calculations were performed using an existing MLP 2×2 dual DAP package. The results of the calculations are shown in Table 1 below.

TABLE 1

| Die Size (mils$^2$) | Substrate | Active Area | Rdson (mΩ) −4.5 V (typ) (max) | Rdson (mΩ) −2.5 V (typ) (max) |
|---|---|---|---|---|
| 35.5 × 24.5 | P++ | 0.00362 | (88.83) (106.59) | (124.71) (168.35) |
| 44.5 × 24.5 | P++ | 0.0048 | (70.1) (84.1) | (97.3) (131.3) |
| 35.5 × 24.5 | P+++ | 0.00318 | (60.21) (75.87) | (92.39) (133.96) |
| 44.5 × 24.5 | P+++ | 0.0042 | (47.63) (60.02) | (71.72) (104.00) |

As shown in Table 2 below, a larger die can result in approximately a 20-22% improvement in Rdson using the inventive leadframe structure described herein. Thus, embodiments of the invention provide for advantageous results that are not achieved using conventional leadframe structures.

TABLE 2

| Substrate | −4.5 V (typ) | −4.5 (max) | −2.5 V (typ) | −2.5 (max) |
|---|---|---|---|---|
| P++ | 21.11% | 21.11% | 22.01% | 22.01% |
| P+++ | 20.89% | 20.89% | 22.37% | 22.37% |

Any recitation of "a", "an" or "the" is intended to mean "one or more" unless specifically indicated to the contrary. Any recitation of "first," "second," etc., may include additional elements as well.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Lastly, one or more features of any one or more embodiments may be combined with features from other embodiments without departing from the spirit and the scope of the invention.

What is claimed is:

1. A method for forming a leadframe structure, the method comprising:
    obtaining a leadframe structure precursor including a first leadframe structure portion and a second leadframe structure portion;
    forming a first recess in the first leadframe structure portion, whereby the first leadframe structure portion thereafter has a first thick portion and a first thin portion;
    forming a second recess in the second leadframe structure portion, whereby the second leadframe structure portion thereafter has a second thick portion and a second thin portion;
    wherein the first thin portion faces the second recess, and the second thin portion faces the first recess in the formed leadframe structure.

2. The method of claim 1 wherein the first and second recesses are formed by etching.

3. The method of claim 1 wherein the first and second recesses are formed in the same etching process.

4. The method of claim 1 further comprising plating the leadframe structure.

5. The method of claim 1 wherein the first leadframe structure portion comprises a lead and the second leadframe structure portion comprises a die attach pad.

6. A method for forming a semiconductor die package comprising:
    forming a leadframe structure according to the method of claim 1; and
    attaching a semiconductor die to the second leadframe structure portion.

7. The method of claim 6 comprising:
    forming a molding material around at least a portion of the leadframe structure and the semiconductor die.

8. The method of claim 7 wherein the semiconductor die comprises a vertical power MOSFET.

9. The method of claim 1 wherein the leadframe structure comprises copper.

10. The method of claim 1 wherein a thickness of the first thin portion is less than 50% of the thickness of the first thick portion.

11. The method of claim 1 wherein a thickness of the second thin portion is less than 50% of the thickness of the second thick portion.

12. The method of claim 11 wherein the first recess and the second recess are formed by etching.

* * * * *